(12) United States Patent
Muraoka et al.

(10) Patent No.: US 9,267,818 B2
(45) Date of Patent: Feb. 23, 2016

(54) MAGNETIC SENSOR DEVICE (71) Applicant: Seiko Instruments Inc., Chiba-shi, Chiba (JP)

(72) Inventors: Daisuke Muraoka, Chiba (JP); Minoru Ariyama, Chiba (JP); Tomoki Hikichi, Chiba (JP); Kentaro Fukai, Chiba (JP)

(73) Assignee: SEIKO INSTRUMENTS INC., Chiba (JP)

( * ) Notice: Subject to any disclaimer, the term of this patent is extended or adjusted under 35 U.S.C. 154(b) by 45 days.

(21) Appl. No.: 14/184,219

(22) Filed: Feb. 19, 2014

(65) Prior Publication Data
US 2014/0232387 A1    Aug. 21, 2014

(30) Foreign Application Priority Data

Feb. 21, 2013   (JP) .................... 2013-032116

(51) Int. Cl.
*G01R 33/07* (2006.01)
*G01D 5/14* (2006.01)
*H03K 17/95* (2006.01)

(52) U.S. Cl.
CPC ............ *G01D 5/145* (2013.01); *H03K 17/9517* (2013.01); *G01R 33/07* (2013.01)

(58) Field of Classification Search
CPC ................................ G01R 33/07; G01D 5/145
USPC ................................................ 324/251, 207.2
See application file for complete search history.

(56) References Cited

U.S. PATENT DOCUMENTS 8,305,075 B2 * 11/2012 Hikichi et al. ................ 324/251
2010/0308815 A1   12/2010 Muraoka et al.

FOREIGN PATENT DOCUMENTS

JP         2010-281801 A2     12/2010

* cited by examiner

*Primary Examiner* — Reena Aurora
(74) *Attorney, Agent, or Firm* — Brinks Gilson & Lione

(57) ABSTRACT

Provided is a magnetic sensor device capable of performing signal processing at high speed with high accuracy. The magnetic sensor device includes: a plurality of Hall elements; a plurality of differential amplifiers to which the plurality of Hall elements are connected, respectively; a detection voltage setting circuit for outputting a reference voltage; and a comparator including: a plurality of differential input pairs connected to the plurality of differential amplifiers, respectively; and a differential input pair connected to the detection voltage setting circuit.

3 Claims, 6 Drawing Sheets

MAGNETIC SENSOR DEVICE

RELATED APPLICATIONS

This application claims priority under 35 U.S.C. §119 to Japanese Patent Application No. 2013-032116 filed on Feb. 21, 2013, the entire content of which is hereby incorporated by reference.

BACKGROUND OF THE INVENTION

1. Field of the Invention

The present invention relates to a magnetic sensor device which converts a magnetic field intensity into an electric signal, and, for example, relates to a magnetic sensor device used as a sensor for detecting an open/close state of a folder-type cellular phone, a notebook computer, or the like or a sensor for detecting a rotational position of a motor.

2. Description of the Related Art

As a sensor for detecting an open/close state in a folder-type cellular phone, a notebook computer, or the like or a sensor for detecting a rotational position of a motor, a magnetic sensor device is used.

A magnetic sensor device outputs a voltage in proportion to a magnetic field intensity or a magnetic flux density by a magnetoelectric converting element (for example, Hall element), amplifies the output voltage by an amplifier, makes a determination using a comparator, and outputs a binary signal of an H signal or an L signal. An output voltage of a magnetoelectric converting element is minute, and thus, an offset voltage of the magnetoelectric converting element (element offset voltage), an offset voltage of the amplifier or the comparator (input offset voltage), or noise generated in the converting element becomes a problem. The element offset voltage is generated mainly by a stress applied to the magnetoelectric converting element from a package or the like. The input offset voltage is generated mainly by variations in the characteristics of an element which forms an input circuit of the amplifier. The noise is generated mainly by flicker noise of a single transistor which forms a circuit or thermal noise of a single transistor or a resistance element.

Figure 4:
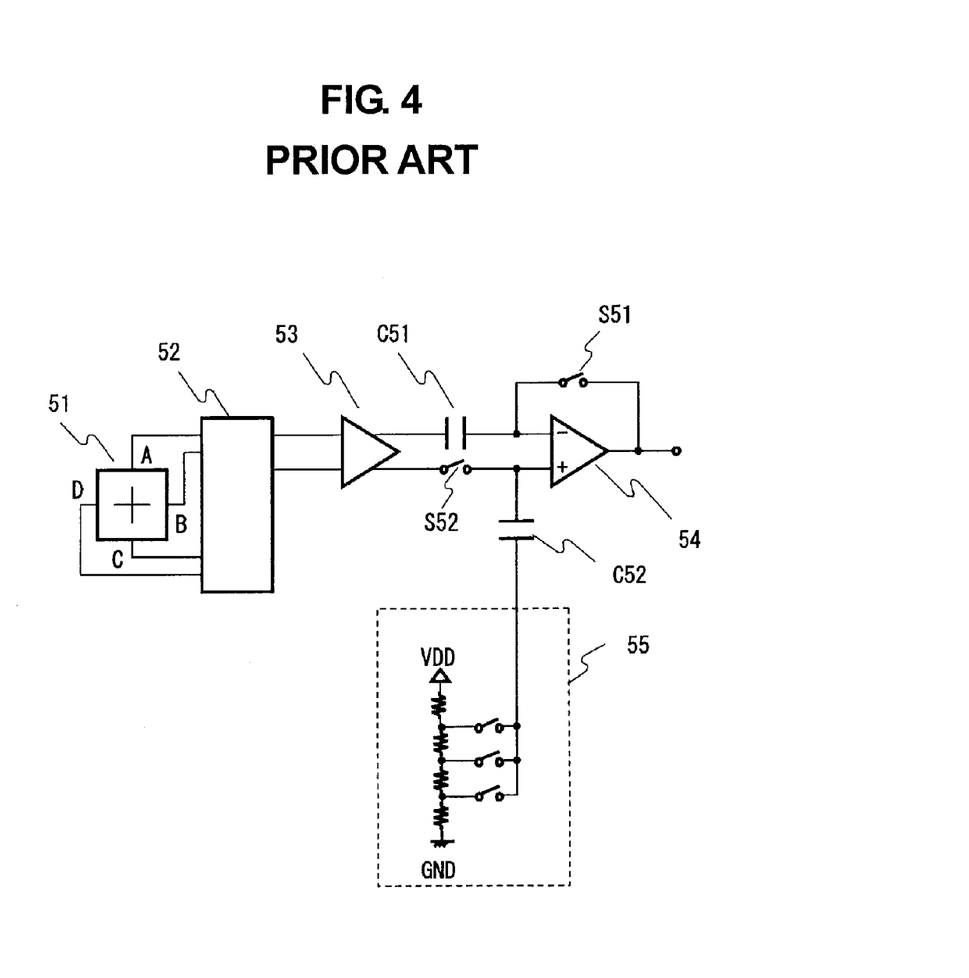
FIG. 4 is a circuit diagram of a related-art magnetic sensor device.

A magnetic sensor device which reduces the effect of an offset voltage of the above-mentioned magnetoelectric converting element or amplifier has been invented (see, for example, Japanese Patent Application Laid-open No. 2010-281801). A related-art magnetic sensor device illustrated in FIG. 4 includes a Hall element 51 which is a magnetoelectric converting element, a changeover switch circuit 52, a differential amplifier 53, a comparator 54, a detection voltage setting circuit 55, a first capacitor C51 and a second capacitor C52, and a first switch S51 and a second switch S52.

Figure 5:
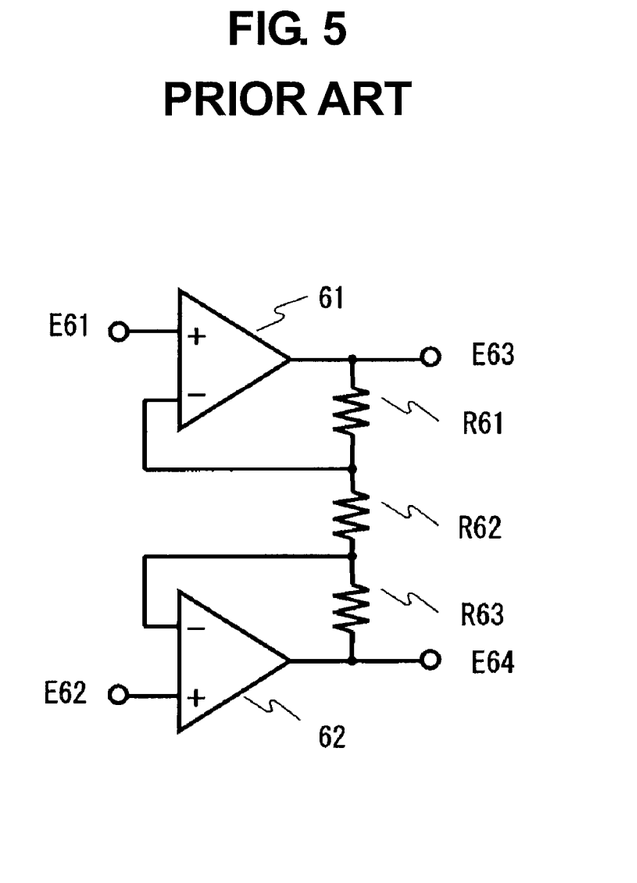
FIG. 5 is an exemplary circuit diagram of a differential amplifier of the related-art magnetic sensor device.

The differential amplifier 53 has an instrumentation amplifier configuration as illustrated in FIG. 5, and includes differential amplifiers 61 and 62 and resistors R61, R62, and R63. Each of the differential amplifiers 61 and 62 operates as a noninverting amplifier. A first input terminal of the differential amplifier 53 is connected to a noninverting input terminal E61 of the differential amplifier 61, a second input terminal of the differential amplifier 53 is connected to a noninverting input terminal E62 of the differential amplifier 62, a first output terminal of the differential amplifier 53 is connected to an output terminal E63 of the differential amplifier 61, and a second output terminal of the differential amplifier 53 is connected to an output terminal E64 of the differential amplifier 62. The differential amplifier 53 having such instrumentation amplifier configuration enables inhibiting the effect of in-phase noise in differential input. In this case, it is assumed that the amplification factors of the differential amplifiers 61 and 62 are set to be equal to each other.

Figure 6:
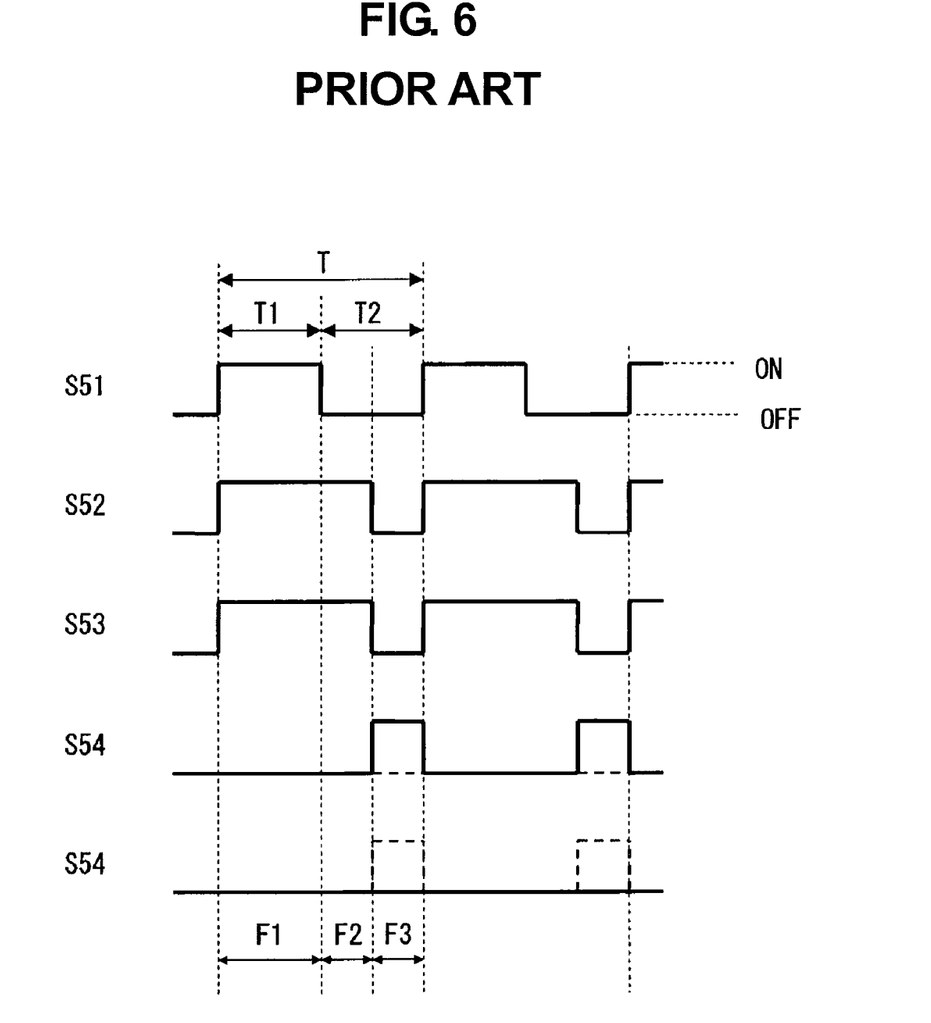
FIG. 6 is a timing chart of the related-art magnetic sensor device.

FIG. 6 shows a timing chart of an operation of the related-art magnetic sensor device. A cycle T of a detection operation is divided into a first detection state T1 in which a power supply voltage is input to a first terminal pair A-C of the Hall element 51 and a detection voltage is output from a second terminal pair B-D by the operation of the above-mentioned changeover switch circuit 52, and a second detection state T2 in which the power supply voltage is input to the second terminal pair B-D and a detection voltage is output from the first terminal pair A-C by the operation of the above-mentioned changeover switch circuit 52. Further, the cycle T is divided into a first sample phase F1, a second sample phase F2, and a comparison phase F3 by opening and closing the respective switches. In the comparison phase F3, offset components are removed.

However, in the related-art magnetic sensor device, time-division operation in which a plurality of signal processing periods such as a sample phase and a comparison phase is necessary to be provided for the purpose of cancelling out offset components, which is inappropriate for high speed signal processing. Further, the time-division operation requires connection of a switch circuit and a capacitor element, which complicates the circuit configuration.

SUMMARY OF THE INVENTION

It is an object of the present invention to provide a magnetic sensor device which utilizes a comparator including a plurality of Hall elements and a plurality of differential input pairs to cancel out offset components of the Hall elements, thereby realizing a highly accurate magnetic field intensity detection, and at the same time, performing high speed signal processing.

In order to solve such related-art problems, a magnetic sensor device according to one embodiment of the present invention has the following configuration.

The magnetic sensor device includes: a plurality of Hall elements; a plurality of differential amplifiers to which the plurality of Hall elements are connected, respectively; a detection voltage setting circuit for outputting a reference voltage; and a comparator including: a plurality of differential input pairs connected to the plurality of differential amplifiers, respectively; and a differential input pair connected to the detection voltage setting circuit.

According to the magnetic sensor device of one embodiment of the present invention, the detection voltage level of the magnetic field intensity can be arbitrarily set by a small scale circuit configuration, and thus, the Hall element offset can be cancelled out, and at the same time, the signal processing can be performed at high speed.

DETAILED DESCRIPTION OF THE PREFERRED EMBODIMENTS

One embodiment of the present invention is described in detail in the following with reference to the attached drawings. A magnetic sensor device according to the present invention is widely used as a sensor for detecting the state of a magnetic field intensity, for example, a sensor for detecting an open/close state in a folder-type cellular phone, a notebook computer, or the like or a sensor for detecting a rotational position of a motor. In the following embodiment, a magnetic sensor device using Hall elements is described, but the converting element according to the present invention may use, instead of a Hall element which outputs a voltage in accordance with a magnetic field intensity, a converting element which similarly outputs a voltage in accordance with a physical quantity such as acceleration or a pressure.

Figure 1:
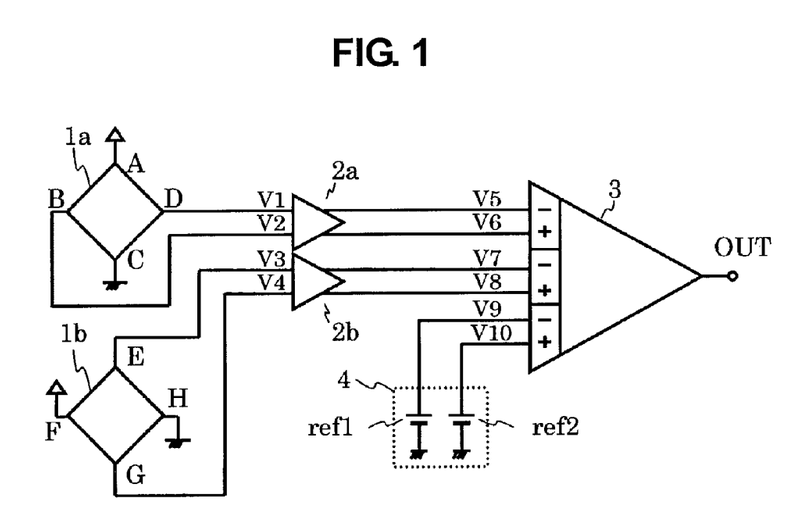
FIG. 1 is a circuit diagram illustrating a magnetic sensor device according to one embodiment of the present invention.

FIG. 1 is a circuit diagram illustrating the magnetic sensor device according to this embodiment.

The magnetic sensor device according to this embodiment includes Hall elements 1a and 1b for outputting a signal voltage in accordance with a magnetic field intensity, differential amplifiers 2a and 2b for amplifying the signal voltage, a comparator 3 including three differential input pairs, and a detection voltage setting circuit 4 for outputting a reference voltage.

The Hall elements 1a and 1b are arranged on a semiconductor substrate so as to be close to each other, and so that a straight line connecting a first terminal pair A-C of the Hall element 1a and a straight line connecting a first terminal pair E-G of the Hall element 1b are parallel to each other. As a result, a straight line connecting a second terminal pair B-D of the Hall element 1a and a straight line connecting a second terminal pair F-H of the Hall element 1b are also parallel to each other. The differential amplifiers 2a and 2b have an instrumentation amplifier configuration illustrated in FIG. 5 which is referred to in the description of the related art. The comparator 3 has a circuit configuration illustrated in FIG. 3, and the detailed description thereof is given below. A voltage VO of an output terminal OUT of the comparator 3 is expressed by Expression (1):

$$VO = A1 \times (V6-V5) + A2 \times (V8-V7) + A3 \times (V10-V9), \quad (1)$$

where A1, A2, and A3 are amplification factors of three differential amplifiers, respectively, which form the comparator 3. The detection voltage setting circuit 4 includes reference voltage circuits ref1 and ref2 for respectively applying arbitrary reference voltages Vref1 and Vref2 to first and second input terminals of a third differential input pair of the comparator 3. Exemplary reference voltage circuits ref1 and ref2 includes a voltage divider including resistors.

Next, an operation of the magnetic sensor device according to this embodiment is described. Transmission of signal components is described under the assumption that a differential output voltage at an output terminal pair of the Hall elements 1a and 1b is denoted by Vh, the element offset voltage is denoted by Voh, the in-phase voltage is denoted by Vcm ($\approx$VDD/2), and the amplification factor of the differential amplifiers 2a and 2b is denoted by G. The direction of a current flow in the Hall element 1a and the direction of a current flow in the Hall element 1b form an angle of 90 degrees, and thus, the offset component in the output terminal pair of the Hall element 1a and the offset component at the output terminal pair of the Hall element 1b are in reverse phase. From the above description, signal voltages at the respective points are calculated as follows:

$$V1 = Vcm - Vh/2 + Voh/2 \quad (2)$$

$$V2 = Vcm + Vh/2 - Voh/2 \quad (3)$$

$$V3 = Vcm - Vh/2 - Voh/2 \quad (4)$$

$$V4 = Vcm + Vh/2 + Voh/2 \quad (5)$$

$$V5 = Vcm - G(Vh/2 - Voh/2) \quad (6)$$

$$V6 = Vcm + G(Vh/2 - Voh/2) \quad (7)$$

$$V7 = Vcm - G(Vh/2 + Voh/2) \quad (8)$$

$$V8 = Vcm + G(Vh/2 + Voh/2) \quad (9)$$

$$V9 = Vref1 \quad (10)$$

$$V10 = Vref2 \quad (11)$$

Substituting the above-mentioned values V5 to V10 into Expression (1) yields Expression (12) which expresses the voltage VO. The differential amplifiers in the comparator 3 are generally identical with one another, and thus, A1=A2=A3=A holds.

$$VO = 2AGVh + A(Vref2 - Vref1) \quad (12)$$

It can be understood that, in this way, the offset components of the Hall elements 1a and 1b are cancelled out, and a comparison can be made between the amplified signal component of the magnetic field intensity and the arbitrarily set reference voltage components. In this embodiment, the voltage VO is an output voltage of a comparator (the value of A is very large), and thus, has a potential of VDD or GND in accordance with the value of Vh. Further, it can be understood that the series of signal processing does not require time-division signal processing unlike the related-art case, which enables high speed signal processing. A switch circuit and a capacitor element which are required for the time-division signal processing are unnecessary, which contributes to chip size reduction, that is, cost reduction.

Here, the comparator 3 is described. The comparator 3 has a circuit configuration illustrated in FIG. 3, and includes a constant current circuit I1, NMOS transistors M43, M44A, M44B, M44C, M45A, M46A, M45B, M46B, M45C, and M46C, and PMOS transistors M41 and M42. The comparator has the following connections. One end of the constant current circuit I1 is connected to a power supply voltage terminal VDD, and the other end is connected to a drain and a gate of the NMOS transistor M43. VBN denotes this node. VBN is connected to gates of NMOS transistors M44A, M44B, and M44C. Sources of the NMOS transistors M43, M44A, M44B, and M44C are connected to a ground terminal VSS. Sources of the NMOS transistors M45A and M46A are connected to a drain of the NMOS transistor M44A, sources of the NMOS transistors M45B and M46B are connected to a drain of the NMOS transistor M44B, and sources of the NMOS transistors M45C and M46C are connected to a drain of the NMOS transistor M44C. Drains of the NMOS transistors M45A, M45B, and M45C are connected to a drain of the PMOS transistor M41. VA denotes this node. Drains of the NMOS transistors M46A, M46B, and M46C are connected to a drain of the PMOS transistor M42. This node is connected to the output terminal OUT of the comparator 3. Gates of the PMOS transistors M41 and M42 are connected to the node VA, and sources of the PMOS transistors M41 and M42 are connected to the power supply voltage terminal VDD. Gates of the NMOS transistors M45A and M46A are respectively connected to a second input terminal V6 and a first input terminal V5 of a first differential input pair. Gates of the NMOS transistors M45B and M46B are respectively connected to a second input terminal V8 and a first input terminal V7 of a second differential input pair. Gates of the NMOS transistors M45C and M46C are respectively connected to a second input terminal V10 and a first input terminal V9 of the third differential input pair.

Figure 3:
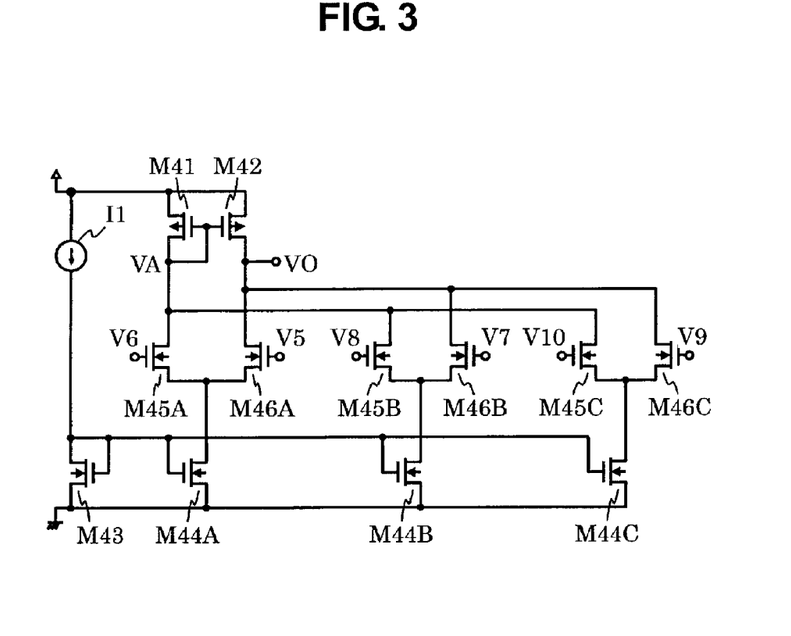
FIG. 3 is an exemplary circuit diagram of a comparator used in the magnetic sensor device according to the embodiments.

Next, an operation of the comparator 3 is described. The constant current circuit I1 generates a constant current and supplies the constant current to the NMOS transistor M43. The NMOS transistors M43, M44A, M44B, and M44C form a current mirror circuit. A current based on a current which flows between the drain and the source of the NMOS transistor M43 flows between the drains and the sources of the NMOS transistors M44A, M44B, and M44C, respectively. The five transistors of the NMOS transistors M44A, M45A, and M46A and the PMOS transistors M41 and M42 form a differential amplifier. The differential amplifier configuration operates so that the difference in gate voltage between the NMOS transistors M45A and M46A, that is, the difference in voltage between the second input terminal V6 and the first input terminal V5 of the first differential input pair, is amplified to be output to the output terminal OUT. A1 denotes this amplification factor. Operations of the current mirror circuit configuration and the differential amplifier configuration are described in detail in literature with regard to a CMOS analog circuit and the like, and thus, detailed description thereof is omitted here. Further, the five transistors of the NMOS transistors M44B, M45B, and M46B and the PMOS transistors M41 and M42 also form a differential amplifier, and operate so that the difference in gate voltage between the NMOS transistors M45B and M46B, that is, the difference in voltage between the second input terminal V8 and the first input terminal V7 of the second differential input pair, is amplified to be output to the output terminal OUT. A2 denotes this amplification factor. Still further, the five transistors of the NMOS transistors M44C, M45C, and M46C and the PMOS transistors M41 and M42 also form a differential amplifier, and operate so that the difference in gate voltage between the NMOS transistors M45C and M46C, that is, the difference in voltage between the second input terminal V10 and the first input terminal V9 of the third differential input pair, is amplified to be output to the output terminal OUT. A3 denotes this amplification factor. In addition, the drains of the NMOS transistors M45A, M45B, and M45C are connected via the node VA to the drain of the PMOS transistor M41, and the drains of the NMOS transistors M46A, M46B, and M46C are connected via the output terminal OUT to the drain of the PMOS transistor M42. With the above-mentioned configuration, the signal voltages which have been input to and amplified by the respective differential amplifiers are added at the node VA and the output terminal OUT. The operation is expressed by above-mentioned Expression (1).

Note that, by increasing the number of the Hall elements to, for example, four, increasing the number of the differential input pairs in the comparator to five (increasing the number of the input terminals to ten) accordingly, and thereby inhibiting the effect of variations in the offsets of the Hall elements, the accuracy of detecting the magnetic field intensity can be further enhanced. In this way, the present invention can accommodate a configuration which utilizes a comparator including a plurality of Hall elements and a plurality of differential input pairs.

Further, by replacing the comparator with a differential amplifier, the magnetic sensor device described in the one embodiment of the present invention can have a configuration which outputs an analog signal.

Figure 2:
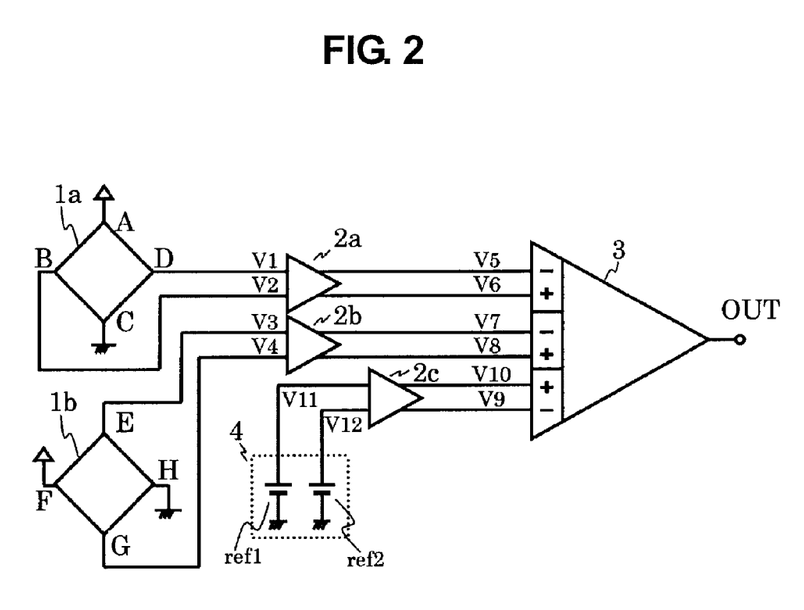
FIG. 2 is a circuit diagram illustrating a magnetic sensor device according to another embodiment of the present invention.

FIG. 2 is a circuit diagram illustrating a magnetic sensor device according to another embodiment of the present invention.

This magnetic sensor device is different from the magnetic sensor device illustrated in FIG. 1 in that a differential amplifier 2c is provided between the first and second input terminals of the third differential input pair of the comparator 3 and the detection voltage setting circuit 4.

A first output terminal and a second output terminal of the differential amplifier 2c are respectively connected to the second input terminal V10 and the first input terminal V9 of the third differential input pair of the comparator 3. The detection voltage setting circuit 4 includes the reference voltage circuits ref1 and ref2 for respectively applying the arbitrary reference voltages Vref1 and Vref2 to two input terminals V11 and V12 of the differential amplifier 2c. Further, the differential amplifiers 2a, 2b, and 2c are arranged on a semiconductor substrate so as to be close to one another, and are identical with one another. Other configurations are the same as those in the magnetic sensor device illustrated in FIG. 1.

Next, an operation of the magnetic sensor device according to this embodiment is described. Transmission of signal components is described under the assumption that the differential output voltage at the output terminal pair of the Hall elements 1a and 1b is denoted by Vh, the element offset voltage is denoted by Voh, the in-phase voltage is denoted by Vcm ($\approx$VDD/2), the amplification factor of the differential amplifiers 2a and 2b is denoted by G, an amplification factor of the differential amplifier 2c is denoted by 2G, an input offset voltage at the first input terminal of each of the differential amplifiers is denoted by Voa1, and an input offset voltage at the second input terminal of each of the differential amplifiers is denoted by Voa2. A systematic offset is regarded as the input offset voltage of the differential amplifier. Similarly to the magnetic sensor device illustrated in FIG. 1, the direction of a current flow in the Hall element 1a and the direction of a current flow in the Hall element 1b form an angle of 90 degrees, and thus, the offset component at the output terminal pair of the Hall element 1a and the offset component at the output terminal pair of the Hall element 1b are in reverse phase. From the above description, signal voltages at the respective points are calculated as follows:

$$V1 = Vcm - Vh/2 + Voh/2 \tag{13}$$

$$V2 = Vcm + Vh/2 - Voh/2 \tag{14}$$

$$V3 = Vcm - Vh/2 - Voh/2 \tag{15}$$

$$V4 = Vcm + Vh/2 + Voh/2 \tag{16}$$

$$V11 = Vref1 \tag{17}$$

$$V12 = Vref2 \tag{18}$$

$$V5 = Vcm - G(Vh/2 - Voh/2 - Voa1) \tag{19}$$

$$V6 = Vcm + G(Vh/2 - Voh/2 + Voa2) \tag{20}$$

$$V7 = Vcm - G(Vh/2 + Voh/2 - Voa1) \tag{21}$$

$$V8 = Vcm + G(Vh/2 + Voh/2 + Voa2) \tag{22}$$

$$V9 = Vcm2 + 2G(Vref2 - Vcm2 + Voa2) \tag{23}$$

$$V10 = Vcm2 + 2G(Vref1 - Vcm2 + Voa1) \tag{24}$$

In this case, Vcm2 is (Vref1+Vref2)/2. Substituting the above-mentioned values V5 to V10 into Expression (1) yields Expression (25) which expresses the voltage VO. Similarly to the one embodiment described above, A1=A2=A3=A holds.

$$VO = 2AG(Vh + Vref1 - Vref2) \tag{25}$$

It can be understood that, in this way, the offset components of the Hall elements $1a$ and $1b$ and the input offset components of the differential amplifiers $2a$, $2b$, and $2c$ are cancelled out, and a comparison can be made between the amplified signal component of the magnetic field intensity and the arbitrarily set reference voltage components. The voltage VO is an output voltage of a comparator (the value of A is very large), and thus, has the potential of VDD or GND in accordance with the value of Vh. Further, it can be understood that, similarly to the magnetic sensor device of FIG. 1, the series of signal processing does not require time-division signal processing unlike the related-art case, which enables high speed signal processing. A switch circuit and a capacitor element which are required for the time-division signal processing are unnecessary, which contributes to chip size reduction, that is, cost reduction.

Note that, similarly to the magnetic sensor device illustrated in FIG. 1, a configuration which utilizes a comparator including a plurality of Hall elements and a plurality of differential input pairs can be accommodated.

Further, also similarly to the magnetic sensor device illustrated in FIG. 1, by replacing the comparator with a differential amplifier, a configuration which outputs an analog signal can be formed.

What is claimed is:

1. A magnetic sensor device for outputting a signal in accordance with an intensity of a magnetic field applied to a Hall element, the magnetic sensor device comprising:
    a plurality of Hall elements;
    a plurality of differential amplifiers to which the plurality of Hall elements are connected, respectively;
    a reference voltage generation circuit configured to output at least one reference voltage; and
    a comparator comprising:
        a plurality of differential input pairs connected to the plurality of differential amplifiers for outputting amplified signal voltages, respectively; and
        a differential input pair connected to the reference voltage generation circuit configured to output a second reference voltage, and wherein the comparator is configured to output a result of comparison of the amplified voltages.

2. A magnetic sensor device according to claim 1, wherein the plurality of differential amplifiers comprise:
    a first differential amplifier comprising:
        a first input terminal and a second input terminal respectively connected to an output terminal pair of a first Hall element; and
        a first output terminal and a second output terminal for outputting amplified signal voltages; and
    a second differential amplifier comprising:
        a first input terminal and a second input terminal respectively connected to an output terminal pair of a second Hall element; and
        a first output terminal and a second output terminal for outputting amplified signal voltages,
    wherein the reference voltage generation circuit is configured to output a second reference voltage,
    wherein the comparator comprises:
        a first differential input pair including a first input terminal and a second input terminal respectively connected to the first output terminal and the second output terminal of the first differential amplifier;
        a second differential input pair including a first input terminal and a second input terminal respectively connected to the first output terminal and the second output terminal of the second differential amplifier; and
        a third differential input pair including a first input terminal and a second input terminal respectively connected to the first reference voltage and the second reference voltage.

3. A magnetic sensor device according to claim 1, further comprising a differential amplifier provided between the reference voltage generation circuit and the differential input pair of the comparator.

* * * * *